(12) United States Patent
Sharma et al.

(10) Patent No.: US 10,177,303 B2
(45) Date of Patent: Jan. 8, 2019

(54) UNIPOLAR MAGNETOELECTRIC MAGNETIC TUNNEL JUNCTION

(71) Applicants: Board of Regents, The University of Texas System, Austin, TX (US); NUtech Ventures, Lincoln, NE (US)

(72) Inventors: Nishtha Sharma, Richardson, TX (US); Peter Dowben, Crete, NE (US); Andrew Marshall, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/877,806

(22) Filed: Jan. 23, 2018

(65) Prior Publication Data

US 2018/0212141 A1 Jul. 26, 2018

Related U.S. Application Data

(60) Provisional application No. 62/449,199, filed on Jan. 23, 2017.

(51) Int. Cl.
| | | |
|---|---|---|
| *G11C 11/00* | (2006.01) | |
| *H01L 43/02* | (2006.01) | |
| *H01L 43/08* | (2006.01) | |
| *G11C 11/16* | (2006.01) | |
| *H01F 10/32* | (2006.01) | |
| *G11C 11/22* | (2006.01) | |
| *G11C 16/04* | (2006.01) | |
| *H01L 45/00* | (2006.01) | |
| *H01L 29/788* | (2006.01) | |
| *H01L 29/78* | (2006.01) | |

(52) U.S. Cl.
CPC .......... *H01L 43/02* (2013.01); *G11C 11/005* (2013.01); *G11C 11/161* (2013.01); *G11C 11/1659* (2013.01); *G11C 11/1675* (2013.01); *G11C 11/22* (2013.01); *G11C 16/0416* (2013.01); *G11C 16/0441* (2013.01); *H01F 10/3254* (2013.01); *H01L 43/08* (2013.01); *H01L 29/788* (2013.01); *H01L 29/78391* (2014.09); *H01L 45/08* (2013.01)

(58) Field of Classification Search
CPC .............................. H01L 43/02; G11C 11/005
USPC ...................................................... 365/158
See application file for complete search history.

(56) References Cited

U.S. PATENT DOCUMENTS

2015/0137289 A1* 5/2015 Khalili Amiri ......... G11C 11/16
257/421

* cited by examiner

*Primary Examiner* — Harry W Byrne
(74) *Attorney, Agent, or Firm* — Schott, P.C.

(57) ABSTRACT

A magneto-electric magnetic tunnel junction device (ME-MTJ) that permits direct driving of ME-MTJ devices by a prior ME-MTJ device is the unipolar magneto-electric magnetic tunnel junction (UMMTJ) device. The UMMTJ device enables full logic circuitry to be implemented without level shifting between each logic element.

20 Claims, 8 Drawing Sheets

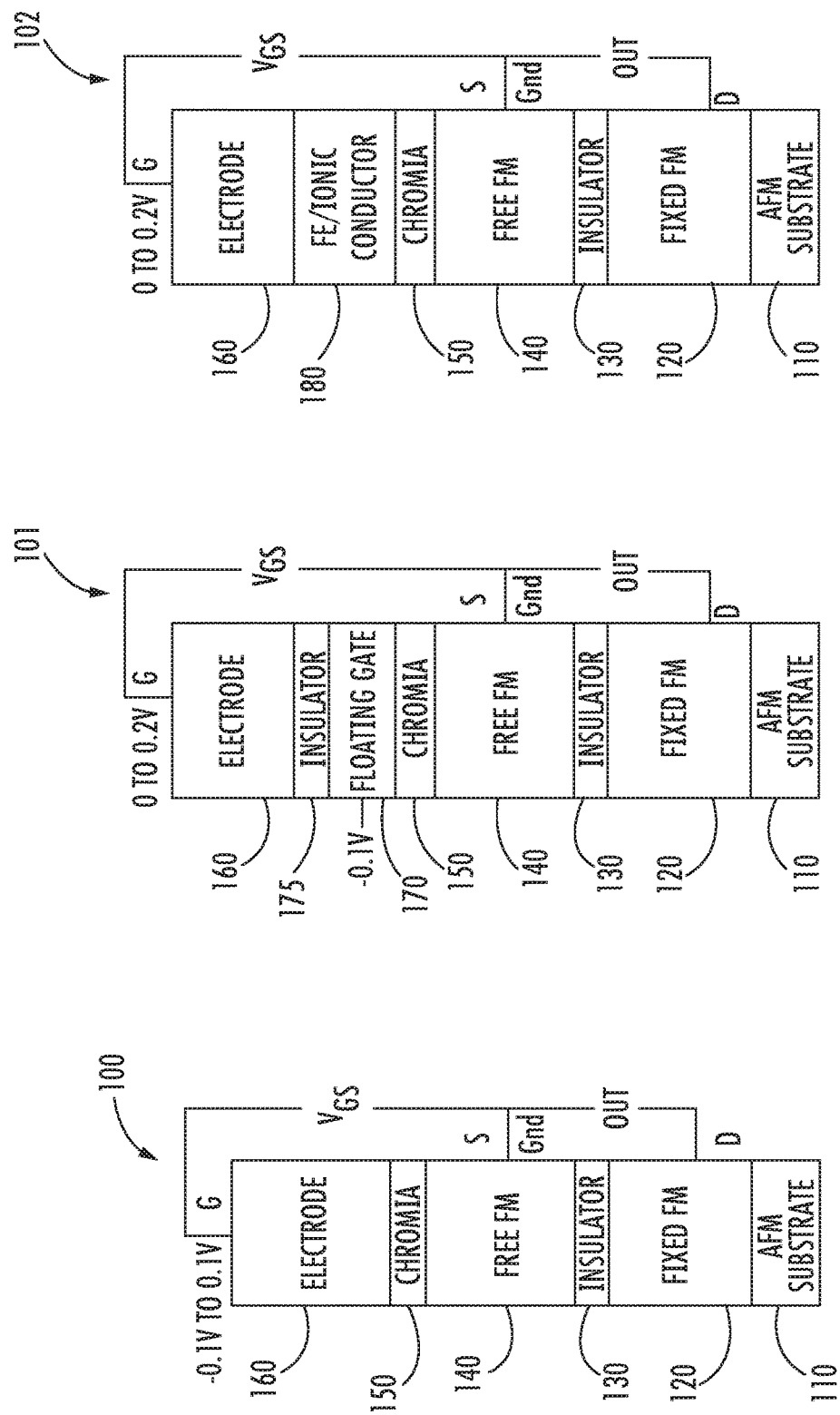

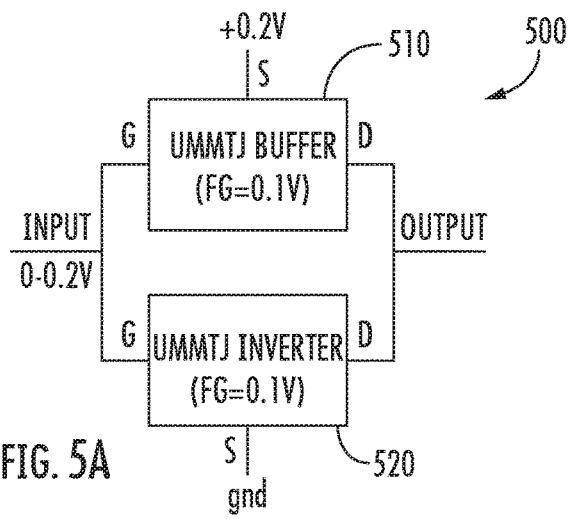
FIG. 5A
| IN | PMOS | NMOS | OUT(IDEAL) | OUT(ACTUAL) |
|---|---|---|---|---|
| 0V | HIGH RESISTANCE | LOW RESISTANCE | 0.2V | 0.184V |
| 0.2V | LOW RESISTANCE | HIGH RESISTANCE | 0 | 0.016V |
FIG. 5B
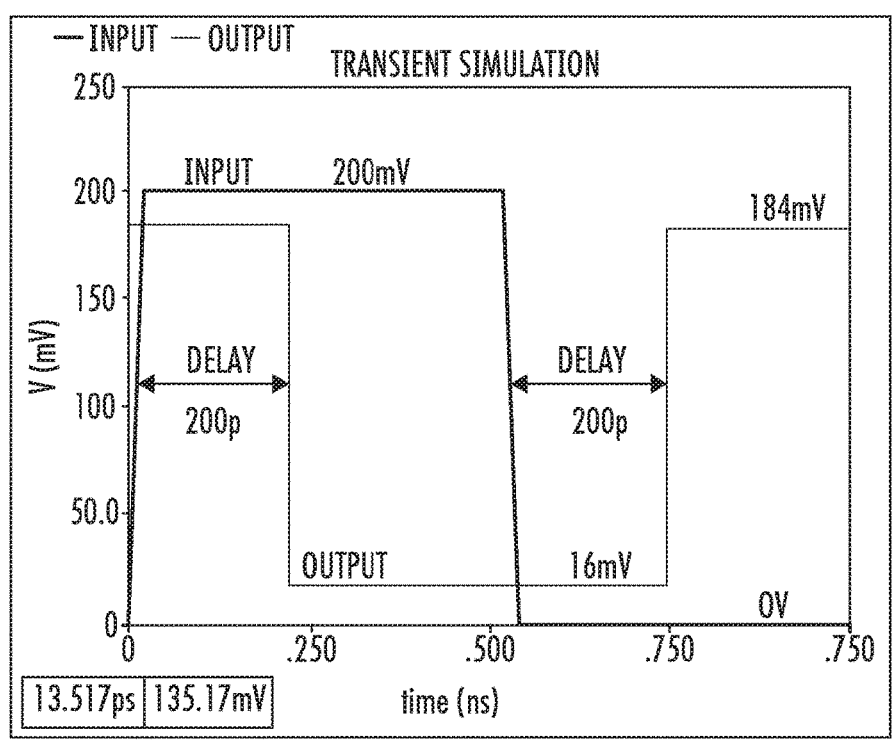
FIG. 5C

UNIPOLAR MAGNETOELECTRIC MAGNETIC TUNNEL JUNCTION

BACKGROUND

Spin-based devices offer non-volatility and compact area compared to complementary metal oxide semiconductor (CMOS) devices. One such spin-based device is the magnetoelectric magnetic tunnel junction device (MEMTJ), which can be thought of as a three terminal beyond-CMOS device with logic and memory capabilities.

The MEMTJ device can be fabricated at the back-end-of-line (BEOL) of the CMOS process between metal layers in a similar manner to that of the spin transfer torque random access memory (STT MRAM), making it compatible with the CMOS process. FIG. 1 shows a MEMTJ device structure 100 that includes at least two ferromagnetic layers: a fixed ferromagnetic layer 120 and a free ferromagnetic layer 140. A thin tunnel dielectric Magnesium oxide (MgO, or another suitable insulator) insulator 130 separates the fixed ferromagnetic layer 120 and free ferromagnetic layer 140. The MEMTJ stack 100 also includes an antiferromagnetic substrate 110 on which the stack may be mounted and a thin chromia ($Cr_2O_3$) layer 150 integrated on top of a free ferromagnetic (FM) layer 140 below the electrode 160.

The MEMTJ structure 100 includes three CMOS-like terminals: "G" or Gate—electrode, "D" or Drain—Fixed FM layer, and "S" or source—Free FM layer. When a voltage $V_{GS}$ is applied across the electrode 160 and free FM layer 140, there is a resulting resistance change, thus a current change is observed across the free and the fixed FM layers 140, 120. Voltage-controlled switching of the ME layers allows switching to be achieved with low power dissipation compared to the CMOS process. The device offers the benefit of low power operation (~aJ), nonvolatility and compact cell area compared to the CMOS process with two process nodes enhancement.

Logic circuits using the ME-MTJ devices draw on a bipolar logic voltage, i.e. positive and negative polarity of the supply voltage, each around 0.1V, and a ground supply. The supplies are required to switch the spin vector state of the magneto-electric antiferromagnetic (MEAFM) chromia spin vector orientation. The switching mechanism utilized for the switching of MTJ cell in the MEMTJ device is exchange biasing.

The MEMTJ device 100 has been used to develop circuits, including a full-adder. In use, however, the input voltage requirement is bipolar (−0.1 v to +0.1 v), while the output voltage (when the resistance across the tunnel layer 130 is converted to voltage), is Unipolar (0 v to 0.2 v). This can and has been resolved with the use of level shifters and/or reset circuitry, but it does require additional, often CMOS circuitry.

SUMMARY OF THE EMBODIMENTS

The device herein enables direct coupling between the ME-MTJ device stages. The unipolar magnetoelectric magnetic tunnel junction (UMMTJ) device concept allows direct coupling of devices using only a unipolar (positive) supply. This is achieved by adjusting the switching threshold of the MEMTJ device.

A unipolar magnetoelectric magnetic tunnel junction device comprising: an electrode; an antiferromagnetic (AFM) substrate; and a level adjusting layer comprising between the electrode and the antiferromagnetic substrate, wherein the level adjusting layer is programmed to offset an input voltage requirement, so the voltage requirement can be switched between states with a positive voltage and a zero voltage.

BRIEF DESCRIPTION OF THE DRAWINGS

FIG. 1A shows a basic layer structure of the ME-MTJ device.

FIG. 1B shows the UMMTJ device structure showing a floating gate between the electrode and chromia layer.

FIG. 1C shows the UMMTJ device structure showing a ferroelectric/ionic conductor inserted between the electrode and chromia layer.

FIG. 5A shows a schematic of the UMMTJ push-pull circuit.

FIG. 5B shows resistance states for different input conditions in an inverter configuration.

FIG. 5C shows transient simulations results for the UMMTJ push-pull configuration.

DETAILED DESCRIPTION OF THE EMBODIMENTS

UMMTJ Device Operation

Figure 2A:
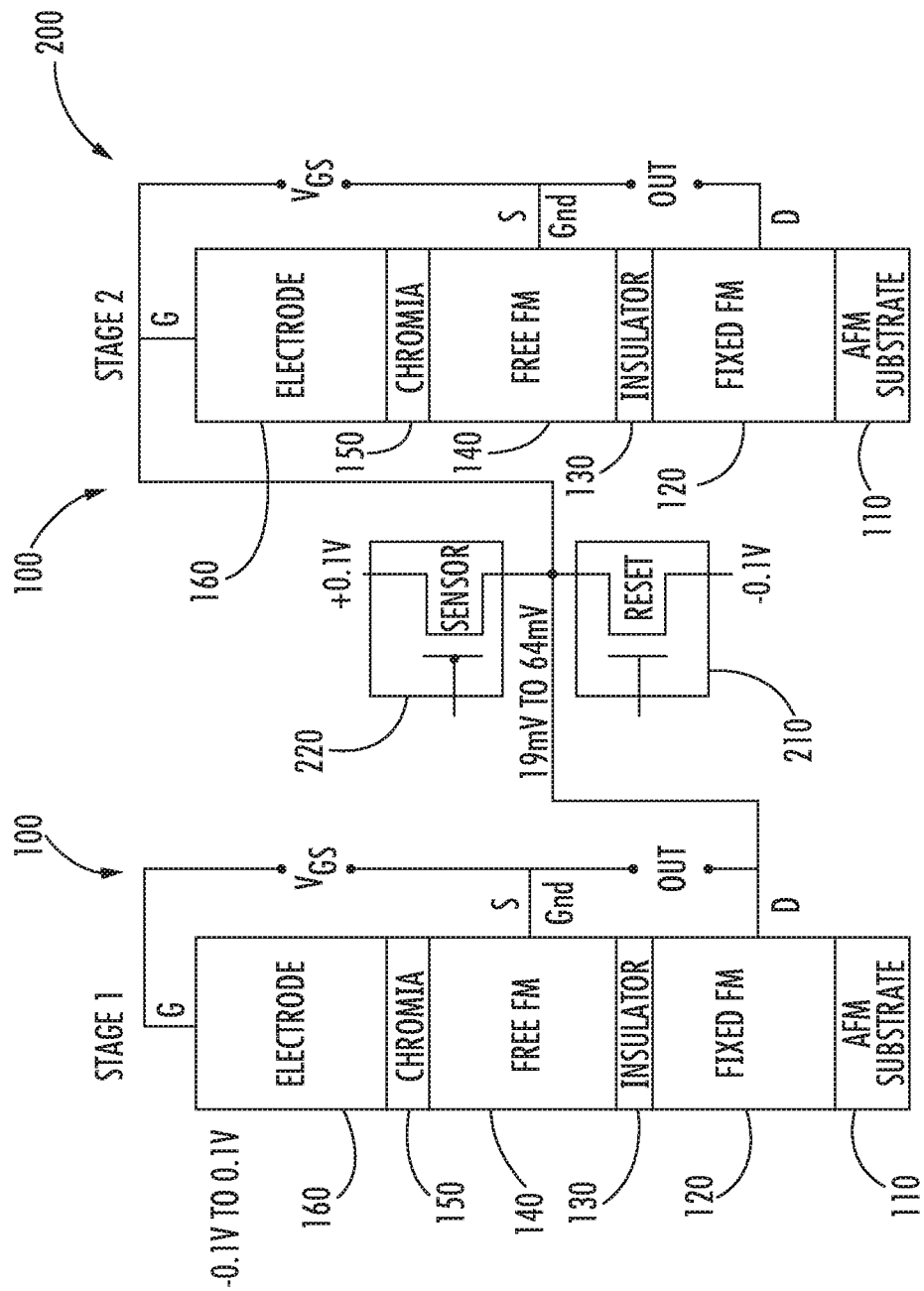
FIG. 2A shows a block diagram of a 2-stage ME-MTJ device with MOS pair for read/write operation.

The switching threshold (Vth) of the device 101 is defined as the voltage required for switching the spin vectors of the chromia layer exchange biased to the free FM layer. To adjust the Vth of the ME-MTJ device, an additional level-shifting layer 170 may be introduced into the gate of the device 101. This can be done in one of the following ways. The first way to adjust the Vth is by placing a floating gate (FG) 170 (and insulator 175) between the electrode 160 and chromia layer 150 in the basic ME-MTJ device shown in FIG. 1A to create the UMMTJ structure 101 shown in FIGS. 1B and 1C. The FG 170 may be programmed to offset the input voltage requirement, so it can be switched between a positive supply (+VDD) and ground. This has similarities to CMOS logic "flash" memory that uses a FG for memory storage, and "analog floating gate" CMOS, which uses floating gates for threshold trimming. The FG 170 may have a programmable charge, trimmed as shown to −0.1V, although this design choice is not meant to be limiting in all contexts.

The net voltage seen by the chromia layer 150 may range from −0.1V to +0.1V as shown in the two-stage device 200 of FIG. 2A, fulfilling the switching condition of the ME-MTJ device. As shown in FIG. 2A, each stage device 100 is the same as those shown in FIG. 1A except as described. A reset signal 210 may be required at each stage 100, 100 to translate the output voltages such that the switching condition of the following ME-MTJ device is fulfilled. The voltage range at ME-MTJ output may be 16-64 mV which enables positive switching with no effect on negative switching. This limitation results in a reset transistor 210 at each stage. Consequently, a reset transistor 210 may not be required to fulfill the switching criteria reducing the CMOS transistor requirement by half for each stage. The sensor 220 is configured as a current source, typically a long channel MOS device or the output node of a current mirror configured PMOS. This acts to sense the output state of the tunnel junction, which is high resistance for non-parallel spin states, and low resistance for parallel. The resultant output voltage at the "D" or drain node is lower in the case of a parallel spin state.

An alternate way to modify the threshold is to add a FE layer or Ionic Conductor 180 shown in the FE layer structure 102 shown in FIG. 1C, which can be programmed initially to the desired state and then maintain its memory state for a long time.

Figure 2B:
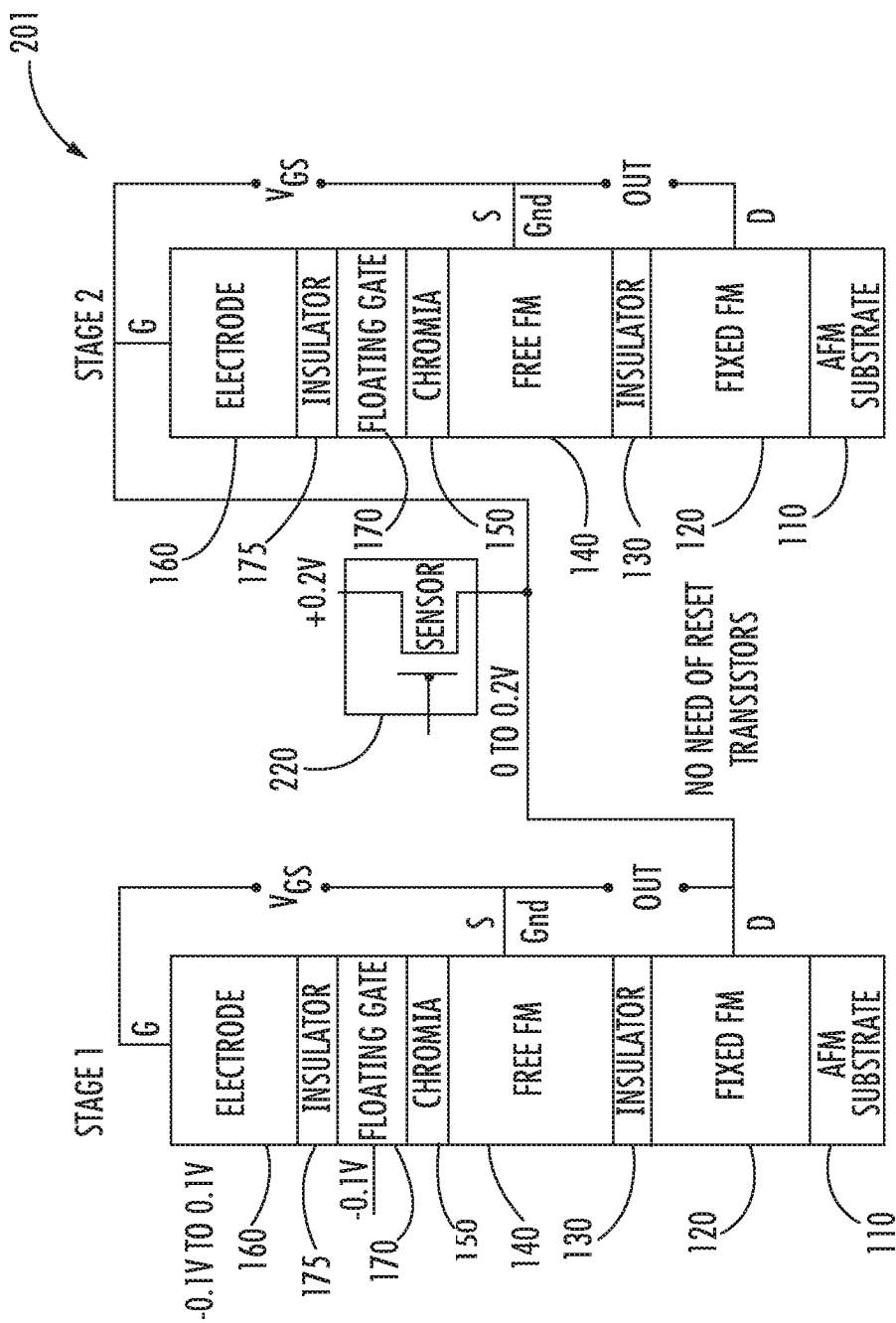
FIG. 2B shows a block diagram of a 2-stage UMMTJ device with a single transistor for read/write operation.

FIG. 2B shows a two-stage device 201 similar to the two-stage device of FIG. 1A, except that the stack may be similar to the UMMTJ stack 101, 102 using the FG 170 or FE/Ionic conductor 180 layers. The voltage shifting would be the same as described above with a level-shifted input, such that the input and output voltage range is the same. The voltage range at UMMTJ output may be is 0-200 mV. Integration of the floating gate reduces the need for the MOS reset transistor 210 requirement per stage by half.

Figures 3A, 3B:
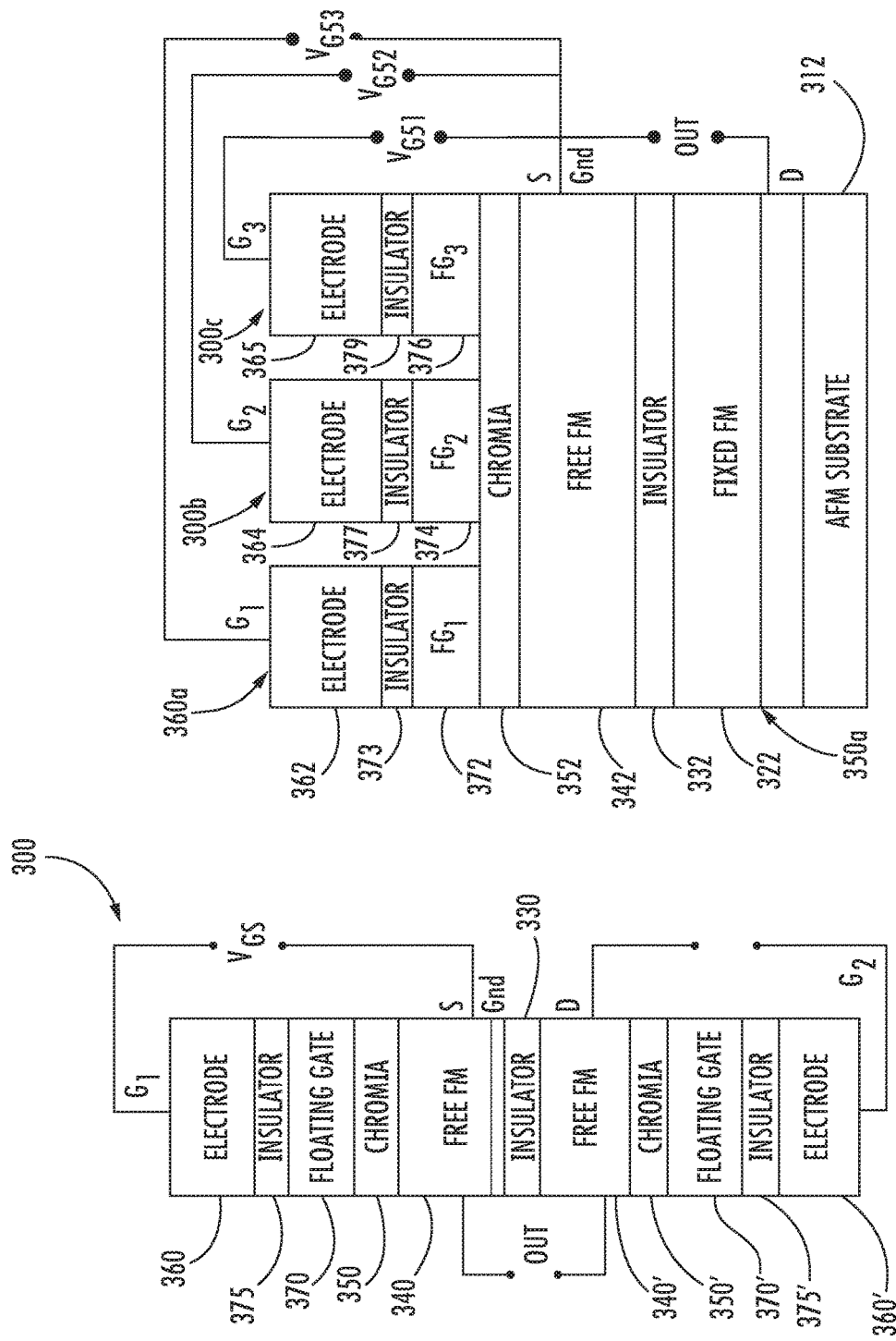
FIG. 3A shows an XNOR gate logic variations with two floating gates modifying the thresholds of the chromia layer.
FIG. 3B shows a UMMTJ based majority gate with separate floating gates sharing a chromia layer.
Figure 3C:
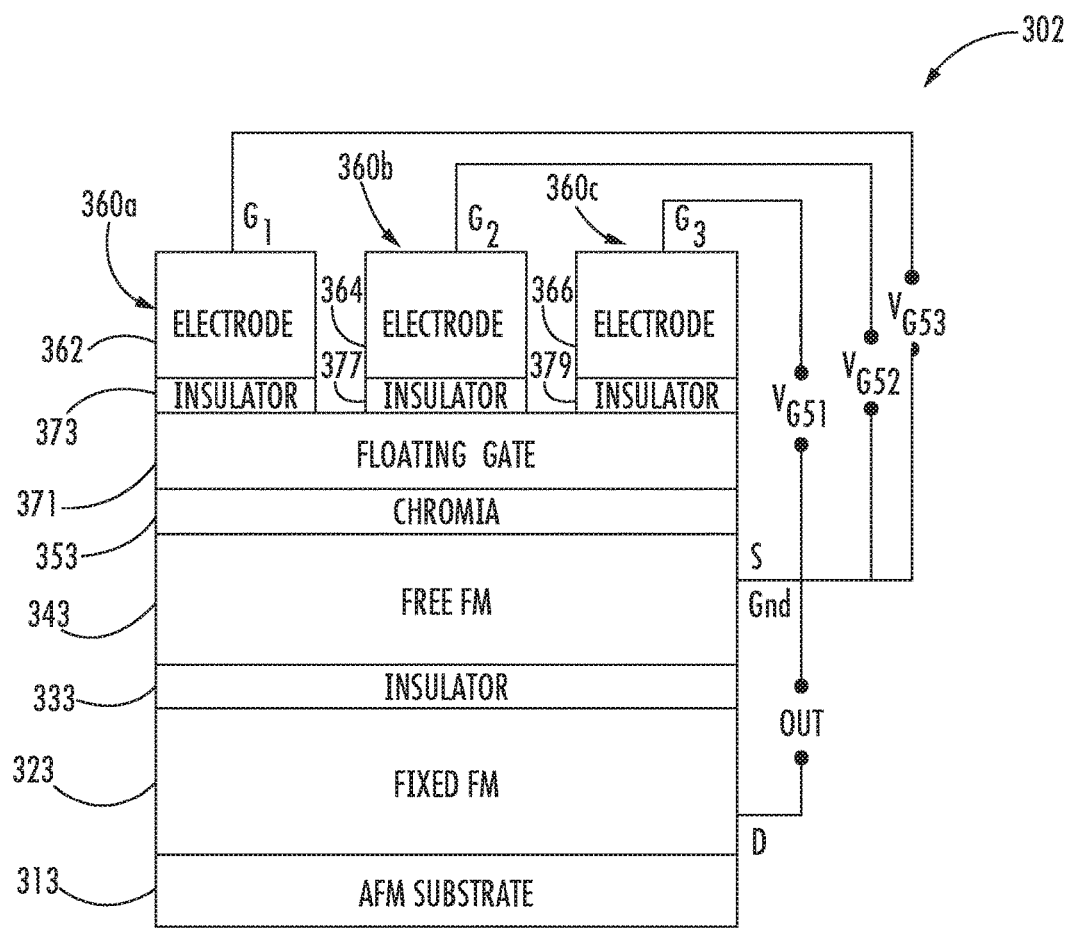
FIG. 3C shows a UMMTJ based majority gate with a merged floating gate.

The UMMTJ devices may be used to construct the XNOR and majority-gate logic as shown in FIGS. 3A, 3B, and 3C. The XNOR gate structure 300 of FIG. 3A includes an insulator 330 separating first and second free FM layers 340, 340'; first and second chromia layers 350, 350'; first and second floating gates 370, 370'; first and second insulators 375, 375'; and first and second electrodes 360, 360'. The XNOR gate structure 300 may also include terminals G1 and G2, and other terminals similar to those shown in previous figures. The XNOR logic 300 may have two floating gates 370, 370' modifying the input voltages across the top and bottom chromia layers 350, 350'. The input voltages may be level-shifted using the additional layers. The operation for both the UMMTJ derived devices remains the same as the ME-MTJ version.

FIG. 3B shows a majority gate version with a shared chromia layer structure 301 where three (or more) floating gates 372, 374, 376; insulators 373, 377, 379; electrodes 362, 364, 366; and terminals G1, G2, and G3 form floating gate substructures 300a, 300b, and 300c respectively. Each terminal G1, G2, G3 is connected to a separate voltage source $V_{GS1}$, $V_{GS2}$, $V_{GS3}$. The floating gate substructures 300a, 300b, and 300c are separated from one another but share a chromia substructure 350a that includes a shared chromia layer 352, free FM layer 342, insulator 332, fixed FM layer 322, all mounted to an AFM substrate 312.

FIG. 3C shows a majority gate version with a merged floating gate structure 302 that may be easier to program, but does not have flexibility to individually program threshold voltages. The merged floating gate structure 302 includes three electrode substructures 360a, 360b, 360c that each include electrodes 362, 364, 366 and insulators 373, 377, 379. The electrode substructures 360a, 360b, 360c share a floating gate 371, chromia layer 353, free FM layer 343, insulator 333, fixed FM layer 323, and AFM substrate 313.

UMMTJ Device Programming

Figure 4A:
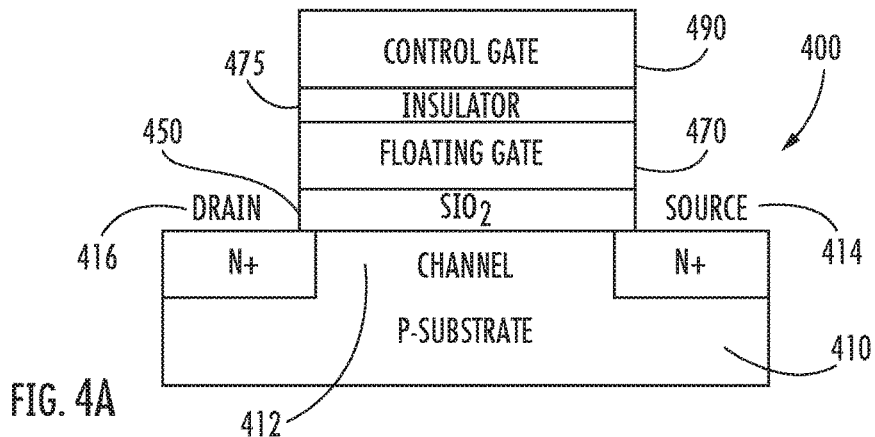
FIG. 4A shows a CMOS flash memory cell.

A CMOS flash memory cell 400 may use a FG 470 (located between a silicon layer 450 and insulator 475) to store a bit by the presence or absence of a charge shown in FIG. 4A. If the FG 470 is not charged (i.e. neutral), then the device 400 operates almost like a normal MOSFET. A positive charge in the control gate 490 creates a channel 412 in the p-substrate 410 that carries a current from source 414 to drain 416. If, however, the FG 470 is negatively charged, then this charge shields the channel region 412 from the control gate 490 and prevents the formation of a channel between source 414 and drain 416.

Figure 4B:
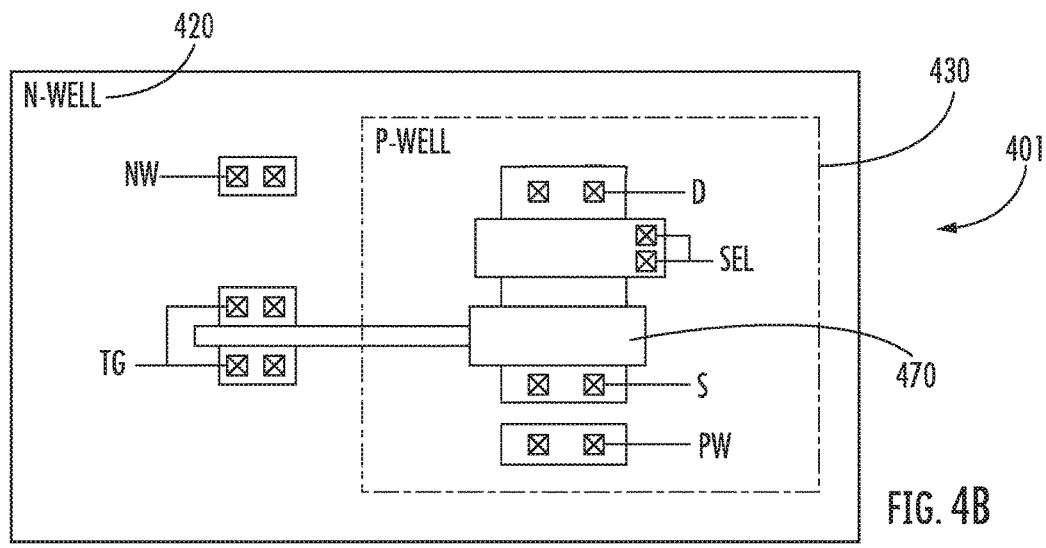
FIGS. 4B and 4C show the top view and cross section view of the floating gate based memory cell.
Figure 4C:
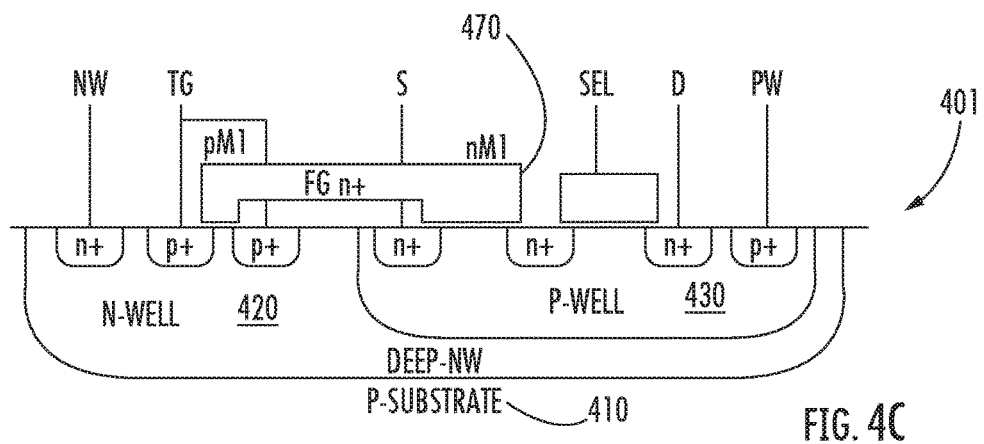

FIGS. 4B and 4C show the top view and cross section view of a floating gate based memory cell 401 having a p-well 430 in an n-well 420. The floating gate 470 connects the n-well 420 and p-well 430. FIGS. 4B and 4C are typical configurations for an analog floating gate. TG becomes the gate as seen by the outside devices, while FG becomes a floating gate, equivalent to the embedded version of FIG. 4A. SEL is a select gate, which need not be part of the circuit. S becomes the source of the NMOS and D the drain of the NMOS. In the case of FIGS. 4B and 4C, a floating gate is located in an NMOS. N-well in these configurations defines an N-type diffusion in the CMOS, possibly phosphorous, the P-well represents a p-type bias into the silicon, generally Boron. Programming a device may be done in one of two forms, depending on whether the layer to be programmed is a charge-based FG or a FE layer.

a) Floating Gate UMMTJ Device Programming

One of the mechanisms to program the FG in the UMMTJ device is Fowler Nordheim (FN) Tunneling. Analog FG devices use this form of charging/discharging. Appropriate programming voltages may be applied through the tunnel junction. This is programmed once, at time zero and does not need programming subsequently and the charge is maintained for several years. Multiple FG based UMMTJ devices can be accessed through a programming transistor that contacts to the tunnel diodes used to program each FG. This circuitry may be housed as CMOS support circuitry beneath the MEMTJ circuitry. If multiple FG based UMMTJ devices need to be programmed to the same level, say if we needed to "add" or "subtract" 0.1V from a stack of devices, it is most efficient to program a group of devices at the same time, using global programming techniques.

b) Ionic Conductor/Ferroelectric UMMTJ Device Programming

For an ionic conductor based UMMTJ device, programming of the switching voltage is as follows: A large voltage (~5-10V) may be applied across the gate and free FM layer. This is sufficient to modify the state of the Ferroelectric/Ionic conductor. The conductor may be set to the required state, and the device can then be operated in MEMTJ mode, where the voltage range is suitable for switching between the ME states.

Unlike the FG based UMMTJ device, here, a global programming device may short-circuit the inputs. To avoid this, the device may use a global control circuit, but with individual transistors to each gate input, in a manner like a global reset (indeed, if a global signal is required, the programming and global signal may serve dual purpose, changing only the input voltage between functions).

Where precision trimming of individual devices is required in a circuit with individual mismatch, a memory array type configuration may be used, such that the devices can be programmed individually. The configuration may resemble a DRAM cell, with an access transistor providing access to the tunnel diode or device gate, depending on the type of configuration.

Each gate may be accessed through a word and bit line; the only difference being the adjustment of the bit line in voltage depending on the requirement of the programming voltage. Alternatively, the word line may also be adjusted to limit the programming time.

Retention Loss

This may or may not be inevitable in both types of the UMMTJ device. Although, it is beneficial to have the built-in structures to enable re-programming, the options differ depending on the type of programmable gate version being employed. It is highly likely that the charge (FG) based system will only need programming only once. This is because the voltage of the programmed gate may typically be only of the order of a hundred millivolts higher or lower than the gate or supply voltages. The field across the oxide and thus the charge loss would be very low. The programming mechanism would most likely be in place, if field reprogramming was required, though additional voltages (charge pumped potentially) would be needed in some cases.

For the case of FE-based gate voltage requirement manipulation, charge loss may occur over a period of weeks to months, which may require reprogramming. Additional programming and selection voltages may be needed in some cases, and be included in the circuit design. Reprogramming is relatively easier than initial programming, as the reprogramming would generally just need "topping off," likely as a batch charging process.

In general, for correcting retention loss, various autozeroing system used in op-amp design may be applied here. A charge capacitor can be used to correct input offset in op-amp and amplifier, a technique that may be applied globally, but it gets more complicated if individual devices need to be corrected for the loss. Another way of solving this is to initially apply the correction to individual devices and then globally for the rest of the cycles. This will depend on the application requirement.

IV. UMMTJ Based Circuits a) CMOS Like Configuration

FIG. 5A shows a schematic of the UMMTJ push-pull circuit 500 including a UMMTJ buffer 510 and UMMTJ inverter 520. The UMMTJ buffer 510 may be programmed to hold charge equivalent to +0.1V and the UMMTJ inverter to −0.1V. This push-pull circuit 500 may have the same logic operation as a CMOS inverter but it does not require any CMOS component for operation. This overcomes the limitation of ME-MTJ based circuits that require a MOS pair at each stage for read/write and reset operation, reducing the circuit area drastically. This also removes the requirement of a MOS pullup transistor for the UMMTJ device to sense the resistance across the free and fixed FM layer at each stage.

Previously developed VerilogA based models of the ME-MTJ device may be modified to enable simulations for the UMMTJ based circuits. FIGS. 5B and 5C show the resistance states of the UMMTJ based buffer 510 and inverter 520 and the input and output voltage ranges. The output is initially set to high. When the input goes high (0.2V), the resistance state of the UMMTJ buffer is low (Rp) and the inverter is high (Rap). Thus, the output goes low (16 mV) after 200 ps which is the intrinsic device delay in ME-MTJ based devices [8]. Conversely, when the input goes low (0V), the resistance state of the buffer is high (Rap) and the inverter is low (Rp), resulting in a high voltage (184 mV) at the output after the device delay. This validates the inverter functionality.

The output voltage swing is higher than the MEMTJ output voltage found in the prior art. The same circuit technique is applicable for any of the conventional CMOS equivalent gates, such as NAND, NOR, AND, OR etc.

b) UMMTJ Based Ring Oscillator

Figure 6A:
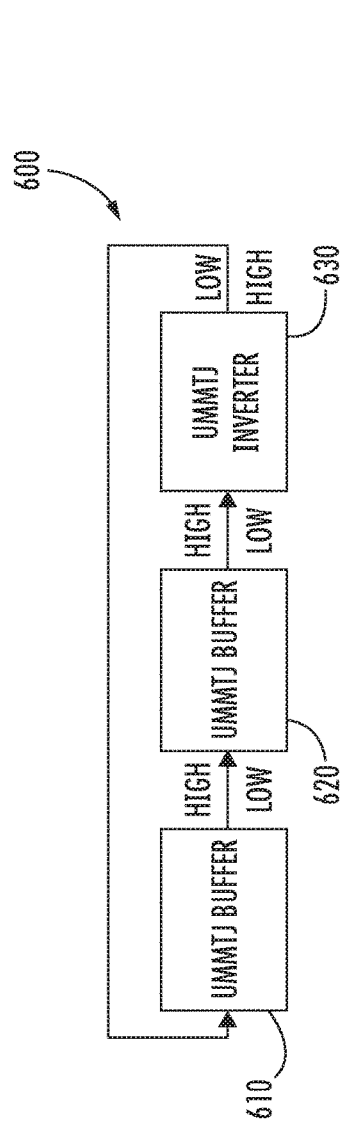
FIG. 6A shows a 3-stage ring oscillator using UMMTJ devices.
Figure 6B:
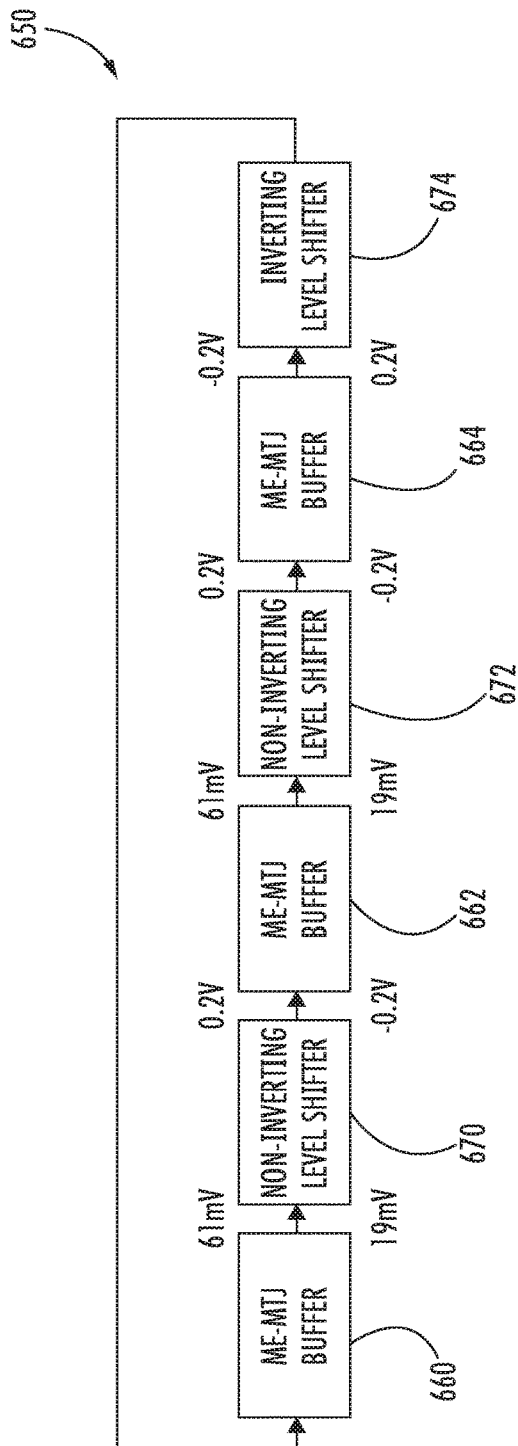
FIG. 6B shows a 3-stage ring oscillator using MEMTJ devices.

FIG. 6A shows the 3-stage UMMTJ ring oscillator 600 schematic using UMMTJ devices. The UMMTJ oscillator uses two UMMTJ buffers 610, 620 and a UMMTJ inverter 630 in series. This compares favorably with the ME-MTJ circuit for a 3-stage ring oscillator 650 shown in FIG. 6B, which uses three MEMTJ buffers 660, 662, 664, two non-inverting level shifters 670, 672, and an inverting level shifter 674. The UMMTJ oscillator 600 eliminates the need for inter-device level shifters 670, 672, 674. The UMMTJ oscillator 600 can be clocked or un-clocked depending on the application requirement and power budget. Resistors or current sources may be used in between the stages to read the state of the device.

V. Applicability

The UMMTJ concept is applicable to voltage-switched ME transistor devices, as well as anomalous hall effect (AHE) device concepts. It may be possible, in addition, to apply this to many spintronic device concepts—noting, however, that since these do not have an intrinsic memory, there may be less need for the technique.

A non-exhaustive list of potential devices that may use the level shifting beneficially: memory devices with voltage variability and/or memory voltage limits, ME-FET, ME-MTJ, STT/DW, SWD, SMG.

For the ME-MTJ, and other magneto-electric devices, by increasing the local electric field, using the FG concept, the static magnetic field may be decreased, which allows for the static magnetic field to be less than the coercive magnetic field of any FM layer. Also, the input voltage requirement for logic operation does not match the output voltage of the device for many beyond CMOS devices. While effective logic performance can be determined, in actual applications the lack of matching input and output requires level shifting or in the case of ME-MTJ, requires reset circuitry.

The UMMTJ circuitry also does not rely on individual device reset/clocking at each stage. Reprogramming of the input range permits effective push-pull circuitry, like CMOS, which can be clocked, if required at all, at a block level. Also, local variation in the various layers can result in individual devices having different threshold voltages (so-called mismatch). Mismatch is present in all current semiconductor families, and is usually accounted for using statistical simulations. Since most of the beyond CMOS device operate at low voltages, device correction may be required.

While the invention has been described with reference to the embodiments above, a person of ordinary skill in the art would understand that various changes or modifications may be made thereto without departing from the scope of the claims.

The invention claimed is:

1. A unipolar magnetoelectric magnetic tunnel junction device comprising:
    an electrode;
    an antiferromagnetic (AFM) substrate; and
    a level adjusting layer comprising between the electrode and the antiferromagnetic substrate, wherein the level adjusting layer is programmed to offset an input voltage requirement, so the voltage requirement can be switched between states with a positive voltage and a zero voltage.

2. The unipolar magnetoelectric magnetic tunnel junction device of claim 1, further comprising:
    a free ferromagnetic (FM) layer;
    a fixed ferromagnetic (FM) layer;

an insulating layer separating the free FM layer and fixed FM layer; and wherein the free FM layer, fixed FM layer, and insulating layer are located between the AFM substrate and the level adjusting layer.

3. The unipolar magnetoelectric magnetic tunnel junction device of claim 2, further comprising a chromia layer located between the level adjusting layer and the free FM layer.

4. The unipolar magnetoelectric magnetic tunnel junction device of claim 3, further comprising a gate terminal connected to the electrode, a drain terminal connected to the fixed FM layer, and a source terminal connected to the free FM layer.

5. The unipolar magnetoelectric magnetic tunnel junction device of claim 4, further comprising a voltage source with voltage applied to the electrode at the gate terminal and free FM layer at the source terminal.

6. The unipolar magnetoelectric magnetic tunnel junction device of claim 1, wherein the level adjusting layer comprises a floating gate.

7. The unipolar magnetoelectric magnetic tunnel junction device of claim 6, wherein the floating gate is programmed by applying an appropriate programming voltage through a tunnel junction.

8. The unipolar magnetoelectric magnetic tunnel junction device of claim 1, wherein the level adjusting layer comprises a ferroelectric layer that can be programmed to a desired state.

9. The unipolar magnetoelectric magnetic tunnel junction device of claim 8, wherein the programming to the desired state includes applying a voltage to the level adjusting layer sufficient to modify a state of the level adjusting layer.

10. The unipolar magnetoelectric magnetic tunnel junction device of claim 1, wherein the level adjusting layer comprises an ionic conductor that can be programmed to a desired state.

11. The unipolar magnetoelectric magnetic tunnel junction device of claim 10, wherein the programming to the desired state includes applying a voltage to the level adjusting layer sufficient to modify a state of the level adjusting layer.

12. A memory device for storing digital data comprising a unipolar magnetoelectric magnetic tunnel junction device comprising:

an electrode;

an antiferromagnetic (AFM) substrate; and a level adjusting layer comprising between the electrode and the antiferromagnetic substrate, wherein the level adjusting layer is programmed to offset an input voltage requirement, so the voltage requirement can be switched between states with a positive voltage and a zero voltage.

13. The memory device of claim 12, further comprising:

a free ferromagnetic (FM) layer;

a fixed ferromagnetic (FM) layer;

an insulating layer separating the free FM layer and fixed FM layer; and wherein the free FM layer, fixed FM layer, and insulating layer are located between the AFM substrate and the level adjusting layer.

14. The memory device of claim 13, further comprising a chromia layer located between the level adjusting layer and the free FM layer.

15. The memory device of claim 14, further comprising a gate terminal connected to the electrode, a drain terminal connected to the fixed FM layer, and a source terminal connected to the free FM layer.

16. The memory device of claim 15, further comprising a voltage source with voltage applied to the electrode at the gate terminal and free FM layer at the source terminal.

17. The memory device of claim 12, wherein the level adjusting layer comprises a floating gate.

18. The memory device of claim 17, wherein the floating gate is programmed by applying an appropriate programming voltage through a tunnel junction.

19. The memory device of claim 12, wherein the level adjusting layer comprises a ferroelectric layer that can be programmed to a desired state.

20. The memory device of claim 19, wherein the programming to the desired state includes applying a voltage to the level adjusting layer sufficient to modify a state of the level adjusting layer.

* * * * *